US009423684B2

(12) United States Patent
Maeshige et al.

(10) Patent No.: US 9,423,684 B2
(45) Date of Patent: Aug. 23, 2016

(54) REFLECTIVE MASK BLANK FOR EUV LITHOGRAPHY AND PROCESS FOR ITS PRODUCTION

(71) Applicant: ASAHI GLASS COMPANY, LIMITED, Chiyoda-ku (JP)

(72) Inventors: Kazunobu Maeshige, Tokyo (JP); Masaki Mikami, Tokyo (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 229 days.

(21) Appl. No.: 14/227,523

(22) Filed: Mar. 27, 2014

(65) Prior Publication Data

US 2014/0212794 A1 Jul. 31, 2014

Related U.S. Application Data

(63) Continuation of application No. PCT/JP2012/080380, filed on Nov. 22, 2012.

(30) Foreign Application Priority Data

Nov. 25, 2011 (JP) ................................ 2011-257749

(51) Int. Cl.
*G03F 1/22* (2012.01)
*G03F 1/24* (2012.01)
(Continued)

(52) U.S. Cl.
CPC . *G03F 1/22* (2013.01); *B82Y 10/00* (2013.01); *B82Y 40/00* (2013.01); *G03F 1/24* (2013.01)

(58) Field of Classification Search
CPC ........................................................ G03F 1/22
See application file for complete search history.

(56) References Cited

U.S. PATENT DOCUMENTS 6,011,646 A 1/2000 Mirkarimi et al.
6,309,705 B1 10/2001 Montcalm et al.
7,056,627 B2 6/2006 Shoki et al.

(Continued)

FOREIGN PATENT DOCUMENTS

JP 2004-104118 4/2004
JP 2004-128490 4/2004

(Continued)

OTHER PUBLICATIONS

International Search Report issued Jan. 22, 2013 in PCT/JP2012/080380 filed Nov. 22, 2012.

*Primary Examiner* — Stephen Rosasco
(74) *Attorney, Agent, or Firm* — Oblon, McClelland, Maier & Neustadt, L.L.P.

(57) ABSTRACT

To provide a process for producing an EUV mask blank, whereby the deformation of a substrate due to film stress in a Mo/Si multilayer reflective film can be reduced, and the change with time of the film stress in the Mo/Si multilayer reflective film can be reduced.

A process for producing a reflective mask blank for EUVL, which comprises forming a multilayer reflective film for reflecting EUV light on a film-forming surface of a substrate, then forming an absorber layer for absorbing EUV light, on the multilayer reflective film, to produce a reflective mask blank for EUV lithography, wherein the multilayer reflective film is a Mo/Si multilayer reflective film, the uppermost layer of the multilayer reflective film is a Si film, and after forming the absorber layer, the substrate on which the absorber layer is formed is subjected to heating treatment at a temperature of from 110 to 170° C.

17 Claims, 1 Drawing Sheet

1´
15
14
13
12
11

(51) Int. Cl.

| | |
|---|---|
| ***B82Y 10/00*** | (2011.01) |
| ***B82Y 40/00*** | (2011.01) |

(56) References Cited

U.S. PATENT DOCUMENTS

| | | | | |
|---|---|---|---|---|
| 7,314,688 | B2 | 1/2008 | Shoki | |
| 2004/0224526 | A1* | 11/2004 | Shoki | B82Y 10/00 430/5 |
| 2006/0270226 | A1 | 11/2006 | Hosoya et al. | |
| 2011/0217633 | A1* | 9/2011 | Hosoya | B82Y 10/00 430/5 |
| 2013/0316272 | A1 | 11/2013 | Hayashi et al. | |
| 2013/0323630 | A1 | 12/2013 | Maeshige et al. | |

FOREIGN PATENT DOCUMENTS

| | | |
|---|---|---|
| JP | 2006-13280 | 1/2006 |
| JP | 4553239 | 7/2010 |
| JP | 4692984 | 3/2011 |
| JP | 4693395 | 3/2011 |
| JP | 4703354 | 3/2011 |
| JP | 2011-238801 | 11/2011 |
| WO | 99/42414 | 8/1999 |

* cited by examiner

REFLECTIVE MASK BLANK FOR EUV LITHOGRAPHY AND PROCESS FOR ITS PRODUCTION

TECHNICAL FIELD

The present invention relates to a reflective mask blank for EUV (Extreme Ultraviolet) lithography (hereinafter, in this specification, "reflective mask blank for EUV lithography" is referred to simply as "EUV mask blank") to be used for the production of semiconductors, etc., and a process for its production.

BACKGROUND ART

Heretofore, in the semiconductor industry, a photolithography method employing visible light or ultraviolet light has been used as a technique to transfer a fine pattern required to form an integrated circuit with a fine pattern on e.g. a silicon substrate. However, the conventional photolithography method has come close to its limit, while miniaturization of semiconductor devices is being accelerated. In the case of the photolithography method, the resolution limit of a pattern is about ½ of the exposure wavelength. Even if an immersion method is employed, the resolution limit is said to be about ¼ of the exposure wavelength, and even if an immersion method of ArF laser (wavelength: 193 nm) is employed, about 45 nm is presumed to be the limit. Under the circumstances, as an exposure technique for the next generation employing an exposure wavelength shorter than 45 nm, EUV lithography (hereinafter, in this specification, "EUV lithography" is referred to simply as "EUVL") is expected to be prospective, which is an exposure technique employing EUV light having a wavelength further shorter than ArF laser. In this specification, EUV light is meant for a light ray having a wavelength within a soft X-ray region or within a vacuum ultraviolet region, specifically for a light ray having a wavelength of from about 10 to 20 nm, particularly about 13.5 nm±0.3 nm (from about 13.2 to 13.8 nm).

EUV light is likely to be absorbed by all kinds of substances, and the refractive index of substances at such a wavelength is close to 1, whereby it is not possible to use a conventional dioptric system like photolithography employing visible light or ultraviolet light. Therefore, in EUV lithography, a catoptric system, i.e. a combination of a reflective photomask and a mirror, is employed.

A mask blank is a stacked member before pattering, to be employed for the production of a photomask. In the case of an EUV mask blank, it has a structure wherein a reflective layer to reflect EUV light and an absorber layer to absorb EUV light, are formed in this order on a substrate made of e.g. glass. As the reflective layer, it is common to use a multilayer reflective film having a low refractive index film and a high refractive index film, alternately stacked to have the light reflectivity improved when its surface is irradiated with EUV light. As a low refractive index film in the multilayer reflective film, a molybdenum (Mo) layer is usually employed, and as a high refractive index film, a silicon (Si) layer is usually employed.

For the absorber layer, a material having a high absorption coefficient to EUV light, specifically e.g. a material containing chromium (Cr) or tantalum (Ta) as the main component, is used.

In a case where a multilayer reflective film is used as a reflective layer of an EUV mask blank, it is necessary to increase the film density of each layer in the multilayer reflective film in order to increase the light ray reflectivity at the time of applying EUV light, and the multilayer reflective film necessarily has a high film stress (namely high compression stress).

If such a high film stress is applied on a substrate, the substrate may be deformed. As a substrate for an EUV mask blank, a substrate made of low expansion glass is usually used, whereby the deformation of the substrate due to the film stress is slight and was not problematic in the past.

However, along with a demand for a fine pattern, the slight deformation of a substrate (namely, the deformation of the substrate due to the application of the film stress) which was not considered as a problem in the past has become problematic. For example, if a deformation larger than a specific size is present in the substrate for an EUV mask blank, specifically, in a case of a 152 mm×152 mm substrate which is usually used for producing an EUV mask blank, if the degree of warpage of the substrate exceeds 0.6 μm, the positioning accuracy of a pattern at the time of patterning the EUV mask blank may deteriorate. Further, if warpage of such a degree results, at the time of transferring a pattern by using a reflective mask produced from the EUV mask blank, the mispositioning of the pattern or pattern defects may result.

Further, it has been confirmed in Patent Document 1 that in an EUV mask blank after production, due to thermal factors, the film stress in a multilayer reflective film changes with time. Further, it has been confirmed in Patent Document 1 that due to thermal factors in a step of cleaning an EUV mask blank or in a baking step after film formation of a resist film carried out for producing a reflective mask from the EUV mask blank, the film stress in a multilayer reflective film changes.

It is disclosed in Patent Document 1 that such a change of the film stress is caused due to extremely small mixing at interfaces of the respective layers constituting the multilayer reflective film. The degree of such a change is at such a level that cannot be detected by measuring the length of a period by x-ray reflectivity film thickness measurement. However, by such a change, a peak wavelength of the reflectivity of the multilayer reflective film (namely, the wavelength at the peak reflectivity of the multilayer reflective film) changes at a level of 0.01 nm. Since EUV light is light having a very short wavelength, the change in the state of the multilayer reflective film very sensitively influences its wavelength property and reflective properties.

Further, since light having a specific short wavelength range is used for an EUV lithography, the influence of the wavelength shift is large, and the shift of the peak wavelength of the reflectivity causes mismatch with a mirror of an exposure system used at the time of transferring a pattern. Thus, the peak wavelength has to be accurately controlled. Further, due to the shift of the peak wavelength, the reflectivity of the multilayer reflective film is lowered. As described above, the change with time of the stress of the multilayer reflective film causes various problems such that the flatness of a substrate is changed, when a mask is practically used.

In Patent Document 1, in order to solve the above problems, at the time of forming a multilayer reflective film and/or after forming the multilayer reflective film, a substrate on which the multilayer reflective film is formed is subjected to heating treatment. Thus, by suppressing the progress of mixing at interfaces of the respective layers which constitute the multilayer reflective film, the change with time of the stress of the formed multilayer reflective film can be suppressed, and the changes in the wavelength properties and the reflective properties of the multilayer reflective film to EUV light which is a exposed light can be prevented.

In Patent Document 1, the heating treatment is preferably carried out before forming an absorber layer, since the peak wavelength and the reflectivity of the multilayer reflective film are measured before and after the heating treatment to inspect whether the change of a pattern size formed on a semiconductor substrate due to displacement of matching with a reflective mirror of a pattern transferring device does not substantially result, which is caused by the change of the peak wavelength and the deterioration of the reflectivity due to the difference between each peak length and the reflectivity.

Further, in Patent Document 1, the above-mentioned heating treatment is carried out by contacting the multilayer reflective film formed on a substrate with liquid kept under heating state. Further, in Patent Document 1, as the liquid used for the heating treatment, a cleaning liquid is used, whereby the heating treatment and the cleaning step can be carried out simultaneously.

PRIOR ART DOCUMENTS

Patent Documents

Patent Document 1: JP-A-2004-128490

DISCLOSURE OF INVENTION

Technical Problem

In Patent Document 1, as the effect of the heating treatment, attention is paid only to suppress the change with time of the stress of the multilayer reflective film. However, it is considered that by the relaxation of the structure of the respective layers which constitute the multilayer reflective film and by the progress of mixing at interfaces, the respective layers which constitute the multilayer reflective film shrink. Further, it is considered that by the shrinkage of the respective layers, the film stress itself in the multilayer reflective film is relaxed. Thus, by the heating treatment, the deformation of the substrate due to the film stress may be reduced.

Accordingly, the present inventors have extensively studied the influence of the heating treatment described in Patent Document 1 on the multilayer reflective film. As a result, it has been confirmed that by the relaxation of the structure of the respective layers which constitute the multilayer reflective film and by the progress of mixing at interfaces, the respective layers which constitute the multilayer reflective film shrink, whereby the film stress is relaxed, and by the relaxation of the film stress, the deformation of the substrate is reduced. Hereinafter, in the present specification, that by the relaxation of the structure of the respective layers which constitute the multilayer reflective film and by the progress of mixing at interfaces, the respective layers which constitute the multilayer reflective film shrink, whereby the film stress is reduced, may sometimes be referred to as the relaxation of the film stress by the relaxation of the structure of the multilayer reflective film and by the mixing.

However, while the film stress is relaxed by the relaxation of the structure of the multilayer reflective film and by the mixing by the heating treatment, depending on conditions of the heating treatment, the change in reflective properties at the time of applying EUV light may sometimes result at a level that the desired values are not satisfied. Specifically, if the mixing in the multilayer reflective film progresses excessively, the respective layers of the multilayer reflective film largely shrink in the thickness direction of the layers, and the reflective properties at the time of applying EUV light, namely the peak wavelength and the reflectivity of reflective light may deteriorate.

Further, it has been found that since the surface of the multilayer reflective film is oxidized at the time of heating treatment, the above-described effect by the heating treatment, namely the relaxation of the film stress by the relaxation of the structure of the multilayer reflective film and by the mixing is impaired.

Here, in a case where a Mo/Si multilayer reflective film is used as the multilayer reflective film, the uppermost layer of the Mo/Si multilayer reflective film is preferably a Si film in order to prevent oxidation at the surface of the multilayer reflective film. However, if a substrate provided with a multilayer reflective film in which the Mo/Si is formed is subjected to heating treatment, the Si film which is the uppermost layer of the multilayer reflective film is oxidized, and the film stress (namely, compression stress) of the Si film increases. Now, the reason why the film stress (compression stress) of the Si film increases, in a case where the Si film which is the uppermost layer of the multilayer reflective film is oxidized, will be described.

At the time of carrying out the heating treatment, oxygen in the atmosphere is adsorbed and diffuses on a surface of the Si film which is the uppermost layer of the Mo/Si multilayer reflective film and which faces the atmosphere, and such oxygen is bonded to Si atoms in the Si film, whereby the structure of the Si film expands, and thereby the film stress (compression stress) in the Si film increases.

Thus, the above-described effect by the heating treatment, namely the relaxation of the film stress by the relaxation of the structure of the multilayer reflective film and by the mixing is impaired.

Further, a protective layer may sometimes be formed on a Mo/Si multilayer reflective film in order to protect the Mo/Si multilayer reflective film at the time of forming a pattern on an absorber layer. As the protective layer to be formed for such a purpose, for example, a Ru film or a Ru compound (for example RuB) film may be mentioned. Further, even in a case where the protective layer is formed on the Mo/Si multilayer reflective film, the uppermost layer of the Mo/Si multilayer reflective film is preferably a Si film.

Also in a case where heat treatment is applied to a substrate provided with a multilayer reflective film in which a Ru film or a Ru compound (such as RuB) film is formed as a protective layer on the Mo/Si multilayer reflective film, due to oxygen which diffuses from a surface of the film (namely, the Ru film or the Ru compound film) which faces the atmosphere, the Si film which is the uppermost layer of the Mo/Si multilayer reflective film is oxidized, and the film stress (compression stress) in the Si film increases.

Further, in general, also in a case where a film other than the Si film is oxidized, the film stress (compression stress) increases. Thus, if the Ru film or the Ru compound film as the protective layer is oxidized, the film stress (compression stress) increases.

Further, if the Si film which is the uppermost layer of the Mo/Si multilayer reflective film is oxidized during the heat treatment, its optical constant changes, and the reflective properties at the time of applying EUV light may change. Specifically, the reflectivity of reflective light may be lowered.

Even in a case where a Ru film or a Ru compound film is formed as a protective layer on the Mo/Si multilayer reflective film, if the Ru film or the Ru compound film is oxidized, its optical constant changes, and thereby the reflective properties at the time of applying EUV light may change. Specifically, the reflectivity of reflective light may be lowered.

In order to solve the above problems, it is an object of the present invention to provide a process for producing an EUV mask blank, whereby the deformation of a substrate due to the film stress in the Mo/Si multilayer reflective film can be reduced, and the change with time of the film stress in the Mo/Si multilayer reflective film can be reduced, and an EUV mask blank produced by such a process.

Solution to Problem

In order to accomplish the above object, the present invention provides a process for producing a reflective mask blank for EUVL, which comprises forming a multilayer reflective film for reflecting EUV light on a film-forming surface (hereinafter in this specification, the main surface on the side where a reflective layer for reflecting EUV light ray and an absorber layer for absorbing EUV light ray are to be formed, may be referred to also as "film-forming surface", the main surface on the opposite side of the film-forming surface may be referred to also as "rear surface") of a substrate, then forming an absorber layer for absorbing EUV light, on the multilayer reflective film, to produce a reflective mask blank for EUV lithography (EUVL), wherein the multilayer reflective film is a Mo/Si multilayer reflective film, the uppermost layer of the multilayer reflective film is a Si film, and after forming the absorber layer, the substrate on which the absorber layer is formed is subjected to heating treatment at a temperature of from 110 to 170° C., preferably from 120 to 160° C.

Further, the present invention provides a process for producing a reflective mask blank for EUVL, which comprises forming a multilayer reflective film for reflecting EUV light on a film-forming surface of a substrate, then forming an absorber layer for absorbing EUV light, on the multilayer reflective film, and forming a low reflective layer to be used for inspection of a mask pattern, on the absorber layer, to produce a reflective mask blank for EUV lithography (EUVL), wherein the multilayer reflective film is a Mo/Si multilayer reflective film, the uppermost layer of the multilayer reflective film is a Si film, and after forming the low reflective layer, the substrate on which the low reflective layer is formed is subjected to heating treatment at a temperature of from 110 to 170° C., preferably from 120 to 160° C.

In the process for producing a reflective mask blank for EUVL, of the present invention, it is preferred that after forming the multilayer reflective film, a protective layer for protecting the multilayer reflective film is formed on the multilayer reflective film, and after forming the absorber layer, the substrate on which the absorber layer is formed is subjected to heating treatment.

In the process for producing a reflective mask blank for EUVL, of the present invention, it is preferred that after forming the multilayer reflective film, a protective layer for protecting the multilayer reflective film is formed on the multilayer reflective film, the absorber layer is formed on the protective layer, the low reflective layer is formed on the absorber layer and after forming the low reflective layer, the substrate on which the low reflective layer is formed is subjected to heating treatment.

The protective layer is preferably a Ru layer or a Ru compound layer.

In the process for producing a reflective mask blank for EUVL, of the present invention, the heating treatment is preferably carried out in the atmospheric air.

In the process for producing a reflective mask blank for EUVL, of the present invention, the absorber layer is preferably a layer containing tantalum (Ta) and nitrogen (N) at the total content of at least 60 at %, and the absorber layer preferably has a film thickness of from 5 to 100 nm.

In the process for producing a reflective mask blank for EUVL, of the present invention, the low reflective layer is preferably a layer containing tantalum (Ta), oxygen (O) and nitrogen (N) at the total content of at least 60 at %, and the low reflective layer preferably has a film thickness of from 1 to 30 nm.

In the process for producing a reflective mask blank for EUVL, of the present invention, the heating treatment is preferably carried out to form a surface oxide film on the absorber layer.

In a case where a low reflective layer is formed on the absorber layer, the heating treatment is preferably carried out to form a surface oxide film on the low reflective layer.

Further, the present invention provides a reflective mask blank for EUVL, which is obtained by the process for producing a reflective mask blank for EUVL, of the present invention and has the surface oxide film having a thickness of from 0.5 to 3 nm on the absorber layer.

Further, the present invention provides a reflective mask blank for EUV lithography, which is obtained by the process for producing a reflective mask blank for EUV lithography, of the present invention and has the surface oxide film having a thickness of from 0.5 to 3 nm on the low reflective layer.

The expression "to " showing the above numerical range is used to include the numerical values before and after thereof as the lower limit value and the upper limit value, and hereinafter in this specification, "to " is used to have the same meaning unless otherwise specified.

Advantageous Effects of Invention

According to the present invention, after forming an absorber layer, a substrate on which the absorber layer is formed is subjected to heating treatment, whereby the oxidation of a Si film which is the uppermost layer of the Mo/Si multilayer reflective film due to the heating treatment can be suppressed. As a result, the film stress can be relaxed by the relaxation of the structure in the multilayer reflective film and by the mixing, and effects by the heating treatment can be maximally obtained. Accordingly, effects by the heating treatment, such as the relaxation of the film stress in the Mo/Si multilayer reflective film, the reduction of the deformation of a substrate caused by the relaxation of the film stress and the suppression of the change with time of the film stress in the Mo/Si multilayer reflective film, can be improved.

Further, by the suppression of oxidation of the Si film, the change of the reflective properties of the Mo/Si multilayer reflective film can be suppressed. Specifically, the deterioration in the reflectivity of reflective light at the time of applying EUV light can be suppressed.

In a case where a Ru film or a Ru compound film is formed as a protective layer on the Mo/Si multilayer reflective film, oxidation of such a film can be suppressed. By suppressing oxidation of such a film, the effect of relaxing the film stress in the multilayer reflective film and the effect of suppressing the change of the reflective properties of the multilayer reflective film can also be obtained.

DESCRIPTION OF EMBODIMENTS

Now, the present invention will be described with reference to the drawings.

Figure 1:
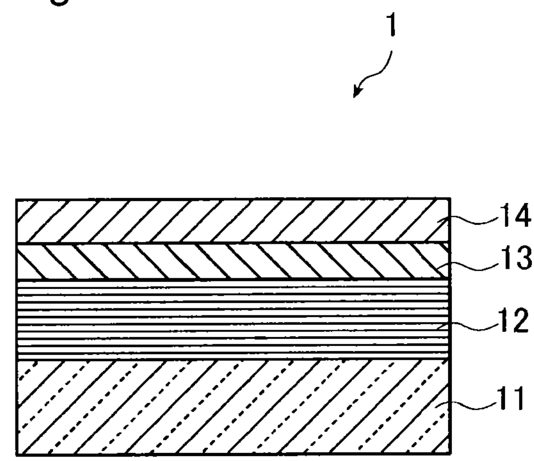
FIG. 1 is a schematic cross-sectional view illustrating an embodiment of the reflective mask blank for EUVL to be produced by the process of the present invention.

FIG. 1 is a schematic cross-sectional view illustrating an embodiment of the reflective mask blank for EUVL (namely EUV mask blank) to be produced by the process of the present invention. The EUV mask blank 1 shown in FIG. 1 has a reflective layer 12 for reflecting EUV light and an absorber layer 14 for absorbing EUV light formed in this order on a substrate 11. Between the reflective layer 12 and the absorber layer 14, a protective layer 13 is formed for protecting the reflective layer 12 during formation of a pattern in the absorber layer 14.

Here, in the EUV mask blank of the present invention, in the construction as shown in FIG. 1, only the substrate 11, the reflective layer 12 and the absorber layer 14 are essential, and the protective layer 13 is an optional constituting element.

Now, the individual constituting elements of the mask blank 1 will be described.

The substrate 11 is required to satisfy the properties as a substrate for a EUV mask blank.

Therefore, the substrate 11 is preferably one having a low thermal expansion coefficient of preferably $0\pm1.0\times10^{-7}$/° C., more preferably $0\pm0.3\times10^{-7}$/° C., further preferably $0\pm0.2\times10^{-7}$/° C., still further preferably$0\pm0.1\times10^{-7}$/° C., particularly preferably $0\pm0.05\times10^{-7}$/° C., and being excellent in smoothness, flatness and durability against a cleaning liquid to be used for e.g. cleaning a mask blank or a photomask after patterning. As the substrate 11, specifically, glass having a low thermal expansion coefficient, such as $SiO_2$—$TiO_2$ type glass, may be used. However, the substrate is not limited thereto, and it is possible to employ a substrate of e.g. crystallized glass having β-quartz solid solution precipitated, quartz glass, silicon, or a metal. Further, a film such as a stress correcting film may be formed on the substrate 11.

The substrate 11 preferably has a smooth surface having a surface roughness (rms) of at most 0.15 nm and a flatness of at most 100 nm, whereby a high reflectivity and transfer precision can be attained by a photomask after forming a pattern.

The surface roughness (rms) is a value obtained by measuring an area of 1 μm×1 μm by means of an Atomic Force Microscope at a resolution of 1.95 nm.

The size, thickness, etc. of the substrate 11 may suitably be determined depending upon e.g. the designed values for the mask. In Examples given hereinafter, a $SiO_2$—$TiO_2$ type glass having a size of 6 inches (152.4 mm) square and a thickness of 0.25 inch (6.3 mm) was used.

It is preferred that no defect is present on a surface t of the substrate 11 which is the side where a reflective layer 12 is to be formed. However, even in a case where a defect is present, in order not to cause a phase defect due to a concave defect and/or a convex defect, it is preferred that the depth of a concave defect or the height of a convex defect is not more than 2 nm, and the half value width of such a concave defect or convex defect is not more than 60 nm.

The property particularly required for the reflective layer 12 of the EUV mask blank is a high EUV light reflectivity. Specifically, when a light ray within the EUV wavelength region is applied at an incident angle of 6° to the surface of the reflective layer 12, the peak reflectivity of light in the vicinity of a wavelength of 13.5 nm is preferably at least 60%, more preferably at least 63%, further preferably at least 65%. Further, even in a case where a protective layer 13 is formed on the reflective layer 12, the peak reflectivity of light in the vicinity of a wavelength of 13.5 nm is preferably at least 60%, more preferably at least 63%, further preferably at least 65%.

As a reflective layer of an EUV mask blank, a multilayer reflective film having a low refractive index layer and a high refractive index layer alternately stacked plural times is widely used, since a high reflectivity can thereby be accomplished in the EUV wavelength region. In the EUV mask blank of the present invention, a Mo/Si multilayer reflective film having a molybdenum (Mo) film as a low refractive index film and a silicon (Si) film as a high refractive index film alternately stacked plural times, is employed. Here, in a case where the Mo film and the Si film are compared, the Si film is more stable against oxidation in atmospheric air at room temperature. Thus, as the uppermost layer of the Mo/Si multilayer reflective film, the Si film is formed in order to prevent a surface of the multilayer reflective film from being oxidized.

In the case of the Mo/Si multilayer reflective film, in order to obtain a reflective layer 12 having the maximum value of the EUV light reflectivity being at least 60%, a Mo film having a thickness of 2.3±0.1 nm and a Si film having a thickness of 4.5±0.1 nm may be stacked repeatedly so that the number of repeating units becomes from 30 to 60.

In the process of the present invention, on a film-forming surface of a substrate, a Mo/Si multilayer reflective film having a Si film as the uppermost layer is formed. For forming a Mo/Si multilayer reflective film having a Si film as the uppermost layer on a film-forming surface of a substrate, each layer constituting the Mo/Si multilayer reflective film may be formed to have a desired thickness by means of a well-known film-forming method such as a magnetron sputtering method or an ion beam sputtering method. For example, in the case of forming a Mo/Si multilayer reflective film by means of an ion beam sputtering method, it is preferred that a Mo film is formed to have a thickness of 2.3 nm at an ion accelerating voltage of from 300 to 1,500 V and a film-deposition rate of 1.8 to 18.0 nm/min by using a Mo target as the target and an Ar gas (gas pressure: $1.3\times10^{-2}$ Pa to $2.7\times10^{-2}$ Pa) as the sputtering gas, and then a Si film is formed to have a thickness of 4.5 nm at an ion accelerating voltage of from 300 to 1,500 V and a film-deposition rate of from 1.8 to 18.0 nm/min by using a Si target as the target and an Ar gas (gas pressure: $1.3\times10^{-2}$ Pa to $2.7\times10^{-2}$ Pa) as the sputtering gas. When this operation is taken as one cycle, the Mo/Si multilayer reflective film having the Si film as the uppermost layer is formed by stacking the Mo film and the Si film by from 30 to 60 cycles.

The protective layer 13 is an optional construction element which is formed for the purpose of protecting the reflective layer 12, so that at the time of forming a pattern in an absorber layer 14 by an etching process, usually a dry etching process, the reflective layer 12 will not be damaged by the etching process. However, from the viewpoint of protecting the reflective layer 12, the protective layer 13 is preferably formed on the reflective layer 12.

As the material for the protective layer 13, a material hardly susceptible to an influence by the etching process of the absorber layer 14 i.e. having an etching rate slower than the absorber layer 14 and hardly susceptible to damage by such an etching process, is selected.

Further, the protective layer 13 is preferably configured such that the protective layer 13 itself also has a high EUV light reflectivity in order not to impair the EUV light reflectivity at the reflective layer 12 even after forming the protective layer 13.

In the EUV mask blank of the present invention, in order to satisfy the above conditions, as the protective layer 13, a Ru layer or a Ru compound layer (such as RuB) is preferably formed. In a case where as the protective layer 13, the Ru layer or the Ru compound layer is formed, the content of Ru in the protective layer 13 is preferably at least 50 at %, more preferably at least 70 at %, further preferably at least 90 at %, particularly preferably at least 95 at %.

In a case where a protective layer 13 is formed on the reflective layer 12, the surface roughness (rms) of the surface of the protective layer 13 is preferably at most 0.5 nm. If the surface roughness of the surface of the protective layer 13 is large, the surface roughness of the absorber layer 14 to be formed on the protective layer 13 tends to be large, whereby the edge roughness of a pattern to be formed on the absorber layer 14 tends to be large, and the dimensional precision of the pattern tends to be poor. As the pattern becomes fine, the influence of the edge roughness becomes distinct, and therefore, it is required that the surface of the absorber layer 14 is smooth.

When the surface roughness (rms) of the surface of the protective layer 13 is at most 0.5 nm, the surface of the absorber layer 14 to be formed on the protective layer 13 will be sufficiently smooth, thus being free from deterioration of the dimensional precision of a pattern due to an influence of the edge roughness. The surface roughness (rms) of the surface of the protective layer 13 is more preferably at most 0.4 nm, further preferably at most 0.3 nm.

In a case where the protective layer 13 is formed on the reflective layer 12, the thickness of the protective layer 13 is preferably from 1 to 10 nm in order that that it is thereby possible to increase the EUV light reflectivity and to obtain an etching resistance property. The thickness of the protective layer 13 is more preferably from 1 to 5 nm, further preferably from 2 to 4 nm.

In the case of forming the protective layer 13 on the reflective layer 12, the protective layer 13 is formed by means of a sputtering method such as a magnetron sputtering method or an ion beam sputtering method.

In a case where a Ru layer is to be formed as the protective layer 13 by means of an ion beam sputtering method, discharge may be made in argon (Ar) atmosphere by using a Ru target as the target. Specifically, the ion beam sputtering may be carried out under the following conditions.

Sputtering gas: Ar (gas pressure: from $1.3\times10^{-2}$ Pa to $2.7\times10^{-2}$ Pa)

Ion accelerating voltage: from 300 to 1,500 V

Film forming rate: from 1.8 to 18.0 nm/min

The property particularly required for the absorber layer 14 is that the EUV light reflectivity is very low. Specifically, the maximum light reflectivity in the vicinity of a wavelength of 13.5 nm at the time of irradiating the surface of the absorber layer 14 with light ray in the wavelength region of EUV light, is preferably at most 2.0%, more preferably at most 1.0%.

In order to attain the above property, the absorber layer 14 is preferably made of a material having a high absorption coefficient of EUV light and is preferably made of a material containing tantalum (Ta) as the main component.

Further, in the EUV mask blank of the present invention, the absorber layer 14 is required to have a function as a barrier layer to suppress the oxidation of the Si film which is the upper most layer of the Mo/Si multilayer reflective film at the time of the heating treatment which is carried out after forming the absorber layer 14.

In order to obtain the function as the barrier layer, the absorber layer 14 preferably has no crystalline interface to prevent oxygen from diffusing. That is, the crystalline state is preferably amorphous. A TaN layer containing Ta and nitrogen (N) is preferred, since the crystalline state easily forms an amorphous film.

In a case where a TaN layer is formed as the absorber layer 14, the total content of Ta and N is preferably at least 60 at % so as to obtain properties as the barrier layer, more preferably at least 80 at %, further preferably at least 95 at %.

In the TaN layer having the above total content of Ta and N as the absorber layer 14, the content of Ta and N and the composition ratio preferably satisfy the following ranges.

The content of Ta: preferably from 10 to 95 at %, more preferably from 60 to 90 At %, the content of N: preferably from 5 to 50 at %, more preferably from 10 to 40 at %, and the composition ratio of Ta and N (Ta:N): 8:1 to 1:5.

As mentioned above, if the surface roughness of the surface of the absorber layer 14 is large, the edge roughness of a pattern to be formed on the absorber layer 14 tends to be large, and the dimensional precision of the pattern deteriorates. As the pattern becomes fine, the influence of the edge roughness becomes distinct, and therefore, the surface of the absorber layer 14 is required to be smooth.

In a case where a layer containing at least Ta and N is formed as the absorber layer 14, its crystal state is amorphous, and the surface smoothness is excellent. Specifically when a TaN layer is formed as the absorber layer 14, the surface roughness (rms) of the surface of the absorber layer 14 becomes at most 0.5 nm. When the surface roughness (rms) of the surface of the absorber layer 14 is at most 0.5 nm, the surface of the absorber layer 14 is sufficiently smooth, whereby the dimensional precision is free from deterioration due to an influence of an edge roughness. The surface roughness (rms) of the absorber layer 14 is more preferably at most 0.4 nm, further preferably at most 0.3 nm.

When the TaN layer is formed as the absorber layer 14, an etching rate at the time when dry etching is carried out by using a chlorine-type gas as the etching gas, is high, and its etching selectivity to the protective layer 13 (specifically a Ru layer or a Ru compound layer) shows at least 10.

Here, in a case where the protective layer 13 is not formed on the reflective layer 12, the reflective layer 12 (specifically, the Si film which is the uppermost layer of the Mo/Si multilayer reflective film) has an etching selectivity of at least 10.

In this specification, the etching selectivity can be calculated by the following formula:

Etching selectivity=(etching rate of absorber layer 14)/(etching rate of protective layer 13 (or reflective layer 12)).

The etching selectivity is preferably at least 10, more preferably at least 11, particularly preferably at least 12.

In order to obtain the function as the barrier layer, the film thickness of the absorber layer 14 is preferably at least 5 nm, more preferably at least 20 nm, further preferably at least 30 nm, particularly preferably at least 50 nm.

On the other hand, if the film thickness of the absorber layer 14 is too large, the precision of a pattern to be formed in the absorber layer 14 tends to be low, and therefore, it is preferably at most 100 nm, more preferably at most 90 nm, further preferably at most 80 nm.

The absorber layer 14 may be formed by using a well-known film-forming method, e.g. a sputtering method such as a magnetron sputtering method or an ion beam sputtering method.

In a case where a TaN layer is to be formed as the absorber layer 14, in the case of using a magnetron sputtering method, the TaN layer may be formed by using a Ta target and letting the target discharge in a nitrogen ($N_2$) atmosphere diluted by Ar.

In order to form a TaN layer as the absorber layer 14 by the above-exemplified method, specifically the method may be carried out under the following film-forming conditions.

Sputtering gas: mixed gas of Ar and $N_2$ ($N_2$ gas concentration: from 3 to 80 vol %, preferably from 5 to 30 vol %, more preferably from 8 to 15 vol %; gas pressure: from $0.5\times10^{-1}$ Pa to $10\times10^{-1}$ Pa, preferably from $0.5\times10^{-1}$ Pa to $5\times10^{-1}$ Pa, more preferably from $0.5\times10^{-1}$ Pa to $3\times10^{-1}$ Pa)

Applied power (for each target): from 30 to 1,000 W, preferably from 50 to 750 W, more preferably from 80 to 500 W Film forming rate: from 2.0 to 60 nm/min, preferably from 3.5 to 45 nm/min, more preferably from 5 to 30 nm/min.

In the process of the present invention, after forming the absorber layer as described above, the substrate on which the absorber layer is formed is subjected to heating treatment at a temperature of from 110 to 170° C., preferably from 120 to 160° C.

By this heating treatment, the relaxation of the structure in each layer constituting the Mo/Si multilayer reflective film and the mixing at interfaces are accelerated. Further, by accelerating the relaxation of the structure and by the mixing, the Mo/Si multilayer reflective film shrinks, whereby the film stress (namely compression stress) of the Mo/Si multilayer reflective film is relaxed. That is, the effect of the heating treatment can be obtained such that the film stress is relaxed by the relaxation of the structure of the Mo/Si multilayer reflective film and by the mixing. Further, by relaxing the film stress, the deformation of the substrate can be reduced.

Further, by accelerating the relaxation of the structure and the mixing, the change with time of the stress in the Mo/Si multilayer reflective film can be suppressed.

As described above, since the absorber layer has a function as the barrier layer, the oxidation of the Si film which is the uppermost layer of the Mo/Si multilayer reflective film can be suppressed. Accordingly, the increase of the film stress due to the oxidation of the Si film can be suppressed.

As a result, the effect by the heating treatment that the film stress is relaxed by the relaxation of the structure of the Mo/Si multilayer reflective film and by the mixing, can be maximally obtained.

Further, by suppressing the oxidation of the Si film which is the uppermost layer of the Mo/Si multilayer reflective film, the change of the reflective properties of the Mo/Si multilayer reflective film can be suppressed. Specifically, the deterioration in the reflectivity of reflective light at the time of applying EUV light can be suppressed.

Further, in the EUV mask blank of the present invention, a protective layer may be formed on the Mo/Si multilayer reflective film in some cases, and as described above, for such a protective layer, a construction material (for example, Ru or a Ru compound) having a function of protecting the Mo/Si multilayer reflective film in an etching process is selected. Further, in order to increase the light ray reflectivity at the time of applying EUV light, the film thickness of the protective layer is preferably thin, and specifically, the film thickness is preferably from 1 to 10 nm.

Thus, even in a case where a protective layer comprising Ru or a Ru compound is formed on a Mo/Si multilayer reflective film, if heating treatment is carried out before forming an absorber layer on the protective layer, the Si film which is the uppermost layer of the Mo/Si multilayer reflective film may be oxidized due to oxygen diffusing from the surface of the protective layer, and thereby, the increase of the film stress (compression stress) in the Si film is a concern.

Further, due to the oxidation of the Si film, the change of the reflective properties of the Mo/Si multilayer reflective film, specifically the deterioration in the reflectivity of reflective light at the time of applying EUV light is a concern.

Further, at the time of the heating treatment, due to the oxidation of a Ru film or a Ru compound film as the protective layer, the increase of the film stress (namely compression stress) in such a film is a concern.

Further, due to such an oxidation of the film, its optical constant changes, and thereby the reflective properties at the time of applying EUV light may change. Specifically, the reflectivity of reflective light at the time of applying EUV light may be lowered.

In the present invention, since the absorber layer has a function as a barrier layer, the oxidation of the Ru film or the Ru compound film as the protective layer and the oxidation of the Si film which is uppermost layer of the Mo/Si multilayer reflective film due to oxygen diffusing from the surface of the protective layer, are suppressed.

By these functions, the effect to relax the film stress in the multilayer reflective film and the effect to suppress the change of the reflective properties of the multilayer reflective film can be obtained.

Here, the specific temperature for the heating treatment may be controlled within the range of from 110 to 170° C., preferably from 120 to 160° C. so as to obtain the desired amount of the stress relaxation. If the heating temperature is lower than 110° C., the effect of the heating treatment to relax the film stress by the relaxation of the structure of the Mo/Si multilayer reflective film and by the mixing, tends to be insufficient.

On the other hand, if the heating temperature is higher than 170° C., the mixing in the Mo/Si multilayer reflective film excessively proceeds, the respective layers of the multilayer reflective film largely shrink, and thereby the reflective properties at the time of applying EUV light may change, specifically the reflectivity of reflective light at the time of applying EUV light may be lowered. The temperature of the heating treatment is preferably from 130° C. to 150° C., more preferably from 136° C. to 144° C.

Further, the heating time is preferably within the range of from 5 to 60 minutes, more preferably within the range of from 10 to 30 minutes. If the heating time is shorter than 5 minutes, the effect of the heating treatment to relax the film stress by the relaxation of the structure in the Mo/Si multilayer reflective film and by the mixing may be insufficient. On the other hand, if the heating time is longer than 60 minutes, the mixing excessively proceeds, the respective layers of the multilayer reflective film largely shrink, the reflective properties at the time of applying EUV light may change, specifically the reflectivity of reflective light at the time of applying EUV light may be lowered.

The heating treatment in the present invention may be carried out in vacuum or in the atmospheric air. Among them, in a case where the heating treatment is carried out in the atmospheric air, the formation of defects from vacuum chamber walls and the adhesion to an EUV mask blank due to heat history formed in the heating treatment in vacuum can be suppressed, and the handling is easy without taking a measure against suffocation due to gas such as nitrogen gas other than the atmospheric air under atmospheric pressure for safety, such being preferred. Further, when the heating treatment is carried out in the atmospheric air after forming an absorber layer, a surface oxide film having at least a specific thickness is formed on the surface of the absorber layer, whereby an effect to protect the absorber layer from the change of the optical properties due to oxidation and the increase of the compressive stress is obtainable, such being preferred. For example, in a case where TaN is used as an absorber layer, by the heating treatment in the atmospheric air, a TaON layer is formed on the absorber layer, and this layer has a function as a film for protecting TaN in a underlayer of the surface oxide film from further oxidation. The surface oxide film formed by the process of the present invention has a thickness of from 0.5 to 3 nm, more preferably from 1.5 to 2.5 nm. If the thickness is less than 0.5 nm, the surface of the absorber layer cannot be sufficiently protected, and the durability against washing may deteriorate. For example, even in a case where after forming the absorber layer, a substrate is left at room temperature in the atmospheric air without carrying out the heating treatment, an extremely thin surface oxide film is formed, however, its film thickness is at most 0.2 nm, and the durability of the absorber layer cannot be improved. On the other hand, if the film thickness is thicker than 3 nm, the maximum light reflectivity to EUV light is high, and in a case where EUV light at a level of 13.5 nm is used as inspection light for a mask pattern, its contrast may deteriorate.

Further, as a method for forming a surface oxide film having a specific thickness on the surface of absorber layer as described above, the heating treatment is not restricted to the atmospheric air. For example, the heating treatment may be carried out in an oxygen ($O_2$) atmosphere or nitrogen ($N_2$) atmosphere which is diluted with inert gas containing at least one selected from the group consisting of helium (He), argon (Ar), neon (Ne), krypton (Kr) and xenon (Xe), or the heating treatment may be carried out in an atmosphere treated in oxygen plasma. Further, even in a case where a surface oxide film is formed by such a method, the film thickness is preferably from 0.5 to 3 nm, more preferably from 1.5 to 2.5 nm.

Further, the EUV mask blank of the present invention may have a constituting element other than the construction shown in FIG. 1 (i.e. the substrate 11, the reflective layer 12, the protective layer 13 and the absorber layer 14).

Figure 2:
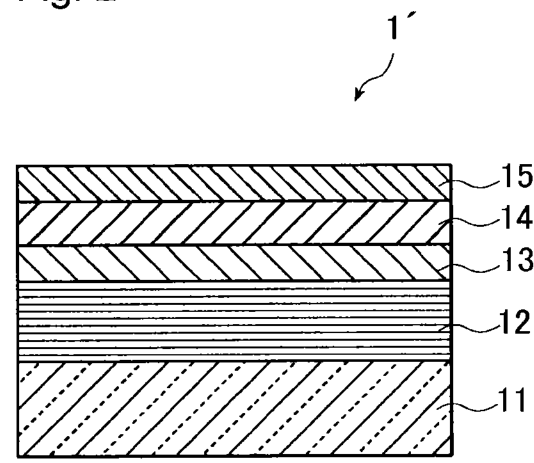
FIG. 2 is a schematic cross-sectional view illustrating another embodiment of the reflective mask blank for EUVL to be produced by the process of the present invention.

FIG. 2 is a schematic cross-sectional view illustrating another embodiment of the EUV mask blank of the present invention.

In the EUV mask blank 1' as shown in FIG. 2, a low reflective layer 15 for inspection light to be used for inspection of a mask pattern is formed on the absorber layer 14.

In the preparation of an EUV mask from the EUV mask blank of the present invention, after forming a pattern in the absorber layer, inspection is carried out to see that this pattern is formed as designed. In this inspection of the mask pattern, an inspection machine using light of usually 257 nm as inspection light, is employed. That is, the inspection is made by the difference in reflectivity of such light of about 257 nm, specifically by the difference in the reflectivity between a surface exposed by removal of the absorber layer 14 by patterning and the surface of the absorber layer 14 remained without being removed by the patterning. Here, in a case where a protective layer 13 is formed on the reflective layer 12 as an embodiment of the EUV mask blank, the former surface (namely a surface exposed by removal of the absorber layer 14 by patterning) is the surface of the protective layer 13; and in a case where no protective layer 13 is formed on the reflective layer 12 as an embodiment of the EUV mask blank, the former surface is the surface of the reflective layer 12 (specifically the surface of a Si layer as the uppermost layer of the Mo/Si multilayer reflective film).

Therefore, if the difference in the reflectivity between the protective layer 13 surface (or the reflective layer 12 surface) and the absorber layer 14 surface to the wavelength of inspection light of about 257 nm, is too small, the contrast at the time of the inspection becomes poor, and an accurate inspection may not be possible.

Hereinafter, In this inspection, so long as the wavelength is not particularly mentioned, inspection light means light having a wavelength of 257 nm.

The absorber layer 14 having the above-described construction has an extremely low EUV light reflectivity and has excellent properties as an absorber layer for an EUV mask blank, but from the viewpoint of the wavelength of inspection light, the light reflectivity may not necessarily be sufficiently low. As a result, the difference between the reflectivity at the absorber layer 14 surface and the reflectivity at the reflective layer 12 surface (or the protective layer 13 surface) at the wavelength of inspection light, tends to be small, and the contrast at the time of inspection may not sufficiently be obtainable. If the contrast at the time of inspection cannot be sufficiently obtained, a defect in the pattern cannot be sufficiently detected in the inspection of a mask, and an accurate inspection of a defect may not be carried out.

Like in the EUV mask blank 1' shown in FIG. 2, by forming a low reflective layer 15 on the absorber layer 14, the contrast at the time of inspection will be good. In other words, the light reflectivity at the wavelength of inspection light becomes very low. With the low reflective layer 15 to be formed for such a purpose, the maximum light reflectivity at the wavelength of inspection light when irradiated with light in the wavelength region (in the vicinity of 257 nm) of inspection light, is preferably at most 15%, more preferably at most 10%, further preferably at most 5%.

When the light reflectivity at the wavelength of inspection light at the low reflective layer 15 is at most 15%, the contrast at the time of the inspection will be good. Specifically, the contrast between reflected light with a wavelength of the inspection light at the protective layer 13 surface (or the reflective layer 12 surface) and reflected light with the wavelength of the inspection light at the low reflective layer 15 surface becomes at least 40%.

In this specification, the contrast is obtained by using the following formula.

$$\text{Contrast (\%)}=((R_2-R_1)/(R_2+R_1))\times 100$$

Here, $R_2$ at the wavelength of the inspection light is the reflectivity at the protective layer 13 surface (or the reflective layer 12 surface), and $R_1$ is the reflectivity at the surface of the low reflective layer 15. Here, the above $R_1$ and $R_2$ are measured in such a state that a pattern is formed in the absorber layer 14 and the low reflective layer 15 of the EUV mask blank 1' shown in FIG. 2. The above $R_2$ is a value measured at the protective layer 13 surface (or the reflective layer 12 surface) exposed as the absorber layer 14 and the low reflective layer 15 were removed by patterning, and $R_1$ is a value measured at the surface of the low reflective layer 15 remained without being removed by patterning.

In the present invention, the contrast represented by the above formula is more preferably at least 45%, further preferably at least 60%, particularly preferably at least 70%.

To attain the above-described properties, the low reflective layer 15 is preferably constituted by a material having a refractive index lower than the absorber layer 14 at the wavelength of inspection light, and its crystal state is preferably amorphous.

As a specific example of such a low reflective layer 15, a TaON layer containing Ta, oxygen (O) and nitrogen (N) in the following ratio may be mentioned.

In a case where a TaON layer is formed as the low reflective layer 15, the total content of Ta, O and N is preferably at least 60 at %, more preferably at least 80 at %, further preferably at least 95 at %.

In the TaON layer containing Ta, O and N at the above total content as the low reflective layer 15, it is preferred to satisfy the following ranges of the content and the compositional ratio of Ta, O and N.

Content of Ta: from 20 to 80 at %, preferably from 20 to 70 at %, more preferably from 20 to 60 at %

Total content of O and N: from 20 to 80 at %, preferably from 30 to 80 at %, more preferably from 40 to 80 at %

Compositional ratio of O to N: from 20:1 to 1:20, preferably from 18:1 to 1:18, more preferably from 15:1 to 1:15

When the low reflective layer 15 is a TaON layer having the above mentioned composition, the low reflective layer is amorphous in its crystal state due to its structure, and the surface is excellent in smoothness. Specifically, when a TaON layer is formed as the low reflective layer 15, the surface roughness (rms) of the low reflective layer 15 surface is at most 0.5 nm.

As mentioned above, in order to prevent the deterioration in the dimensional precision of a pattern due to an influence of the edge roughness, it is required that the absorber layer 14 surface is smooth. The low reflective layer 15 is formed on the absorber layer 15, and therefore, for the same reason, its surface is required to be smooth.

When the surface roughness (rms) of the low reflective layer 15 surface is at most 0.5 nm, the low reflective layer 15 surface is sufficiently smooth and free from the deterioration in the dimensional precision of a pattern due to an influence of the edge roughness. The surface roughness (rms) of the low reflective layer 15 surface is more preferably at most 0.4 nm, further preferably at most 0.3 nm.

In a case where the low reflective layer 15 is formed on the absorber layer 14, the total thickness of the absorber layer 14 and the low reflective layer 15 is preferably from 20 to 130 nm. Further, if the thickness of the low reflective layer 15 is more than the thickness of the absorber layer 14, the EUV light absorbing property at the absorber layer 14 is likely to be low, and therefore, the thickness of the low reflective layer 15 is preferably less than the thickness of the absorber layer 14. For this reason, the thickness of the low reflective layer 15 is preferably from 5 to 30 nm, more preferably from 10 to 20 nm.

The low reflective layer (TaON) having the above construction may be formed by a sputtering method such as a magnetron sputtering method or an ion beam sputtering method by using a Ta target in an atmosphere of oxygen ($O_2$) and nitrogen ($N_2$) diluted with an inert gas containing at least one of helium (He), argon (Ar), neon (Ne), krypton (Kr) and xenon (Xe). Otherwise, a Ta target may be discharged in a nitrogen ($N_2$) atmosphere diluted with an inert gas containing at least one of helium (He), argon (Ar), neon (Ne), krypton (Kr) and xenon (Xe) to form a film containing Ta and N, and then the formed film is oxidized by e.g. being exposed to oxygen plasma or being irradiated with an ion beam using oxygen, to obtain the low reflective layer (TaON) having the above construction.

In order to form the low reflective layer (TaON) by the above method, specifically the following film-forming conditions may be employed.

Sputtering gas: mixed gas of Ar, $O_2$ and $N_2$ ($O_2$ gas concentration: from 5 to 80 vol %, $N_2$ gas concentration: from 5 to 75 vol %, preferably $O_2$ gas concentration: from 6 to 70 vol %, $N_2$ gas concentration: from 6 to 35 vol %, more preferably $O_2$ gas concentration: from 10 to 30 vol %, $N_2$ gas concentration: from 10 to 30 vol %, Ar gas concentration: from 5 to 90 vol %, preferably from 10 to 88 vol %, more preferably from 20 to 80 vol %);

Sputtering gas pressure: from $1.0\times10^{-1}$ Pa to $50\times10^{-1}$ Pa, preferably from $1.0\times10^{-1}$ Pa to $40\times10^{-1}$ Pa, more preferably from $1.0\times10^{-1}$ Pa to $30\times10^{-1}$ Pa;

Applied power: from 30 to 1,000 W, preferably from 50 to 750 W, more preferably from 80 to 500 W Film forming rate: from 0.1 to 50 nm/min, preferably from 0.2 to 45 nm/min, more preferably from 0.2 to 30 nm/min.

Here, in a case where an inert gas other than Ar is used, the concentration of such an inert gas is adjusted to be within the same concentration range as the above Ar gas concentration. Further, in a case where plural types of inert gases are used, the total concentration of such inert gases is adjusted to be within the same concentration range as the above Ar gas concentration.

Further, the EUV mask blank 1" illustrated in FIG. 2 is subjected to the above-mentioned heating treatment, after forming a low reflective layer 15. Even in a case where the heating treatment is carried out after forming a low reflective layer 15 on an absorber layer 14, it is preferred that under the same atmosphere of the heating treatment on the mask blank illustrated in FIG. 1 after forming an absorber layer 14, namely, in atmospheric air or in vacuum, and under the predetermined conditions, a surface oxide film is formed on a surface of the low reflective layer 15 by the heating treatment method. The temperature of the heating treatment on a substrate on which the low reflective layer 15 is formed after forming the low reflective layer 15 is also carried out at the same temperature as the heating treatment after forming the absorber layer 14, namely at a temperature of from 110 to 170° C. More preferably, the temperature of the heating treatment is from 120 to 160° C., further preferably from 130 to 150° C., still further preferably from 136 to 144° C. Further, the heating time is similarly preferably from 5 to 60 minutes, more preferably from 10 to 30 minutes.

Further, in such a case, the film thickness of the surface oxide film formed on the surface of the low reflective layer 15 is preferably from 0.5 to 3 nm, more preferably from 1.5 to 2.5 nm. If the thickness is less than 0.5 nm, the surface of the absorber layer cannot be sufficiently protected, and the durability against washing may deteriorate. On the other hand, if the thickness exceeds 3 nm, the maximum light ray reflectivity to inspection light for a mask pattern is high, and its contrast may deteriorate. For example, in a case where the low reflective layer 15 is made of TaON, a surface oxide film to be formed by the heating treatment after forming the low reflective layer is made of TaON having abundant oxygen namely has a composition having a large amount of oxygen (O) compared to TaON formed as the low reflective layer. In such a case, the surface oxide film is a layer having a different construction from the low reflective layer TaON. Specifically, the surface oxide film on TaON can be distinguished based on the composition of oxygen and identified as a surface oxide film which is a layer having the compositional ratio of oxygen higher by at least 5 at % than the TaON layer as the low reflective layer.

The reason as to why it is preferred to form a low reflective layer 15 on the absorber layer 14 as in the EUV mask blank 1' shown in FIG. 2, is that the wavelength of inspection light for a pattern is different from the wavelength of EUV light. Therefore, in a case where EUV light (in the vicinity of 13.5 nm) is used as the inspection light for a pattern, it is considered unnecessary to form a low reflective layer 15 on the absorber layer 14. The wavelength of inspection light tends to be shifted toward a low wavelength side as the size of a pattern becomes small, and in future, it is considered to be shifted to 193 nm or further to 13.5 nm. Further, in the case where the wavelength of inspection light is 193 nm, it may not be required to form a low reflective layer 15 on the absorber layer 14. In the case where the wavelength of inspection light is 13.5 nm, it is considered unnecessary to form a low reflective layer 15 on the absorber layer 14.

The EUV mask blank of the present invention may have a functional film commonly known in the field of EUV mask blanks, in addition to the reflective layer 12, the protective layer 13, the absorber layer 14 and the low reflective layer 15. A specific example of such a functional film may, for example, be a high electrically conductive coating formed on the rear side of a substrate to promote the electrostatic chucking of the substrate, as disclosed in e.g. JP-A-2003-501823. Here, in the substrate 11 shown in FIG. 1, the rear side of the substrate means the surface on the opposite side to the side where the reflective layer 12 is formed. For the high electrically conductive coating to be formed on the rear side of the substrate for such a purpose, the high electrical conductivity and the thickness of the constituting material are selected so that the sheet resistance will be at most 100 Ω/□. The constituting material of the electrically conductive coating may be selected widely from those disclosed in known literatures. For example, a high dielectric constant coating disclosed in JP-A-2003-501823, specifically a coating comprising silicon, TiN, molybdenum, chromium and TaSi may be applied. The thickness of the high dielectric constant coating may, for example, be from 10 to 1,000 nm.

The high dielectric constant coating may be formed by means of a known film-forming method e.g. a sputtering method, such as a magnetron sputtering method or an ion beam sputtering method, a CVD method, a vacuum vapor deposition method or an electroplating method.

EXAMPLES

Now, the present invention will be described in further detail with reference to Examples.

Example 1

In this Example, an EUV mask blank 1 illustrated in FIG. 1 was prepared.

As a substrate 11 for film formation, a $SiO_2$-$TiO_2$ type glass substrate (size: 6 inches (152.4 mm) square, thickness: 6.3 mm) was used. The thermal expansion coefficient of this glass substrate was $0.2\times10^{-7}$/° C., the Young's modulus was 67 GPa, the Poisson ratio was 0.17, and the specific rigidity was $3.07\times10^{7}$ $m^2/s^2$. This glass substrate was polished to form a smooth surface having a surface roughness (rms) of at most 0.15 nm and a flatness of at most 100 nm.

On the rear surface side of the substrate 11, a Cr film having a thickness of 100 nm was formed by means of a magnetron sputtering method to provide a high electrically conductive coating (not shown in the drawings) having a sheet resistance of 100 Ω/□.

By using the formed Cr film formed by the above order, the substrate 11 (size: 6 inches (152.4 mm) square, thickness: 6.3 mm) was fixed to a usual electrostatic chuck of a flat plate shape, and on the surface of the substrate 11, a Mo film and then a Si film were alternately formed by means of an ion beam sputtering method for 50 cycles to form a Mo/Si multilayer reflective film (reflective layer 12) having a total thickness of 340 nm ((2.3 nm+4.5 nm)×50). Here, the uppermost layer of the multilayer reflective film is a Si film.

The film forming conditions for the Mo film and the Si film are as follows.

(Film forming conditions for Mo film)

Target: Mo target
Sputtering gas: Ar gas (gas pressure: 0.02 Pa)
Voltage: 700 V
Film forming rate: 3.84 nm/min
Film thickness: 2.3 nm (Film forming conditions for Si film)

Target: Si target (boron-doped Si target)
Sputtering gas: Ar gas (gas pressure: 0.02 Pa)
Voltage: 700 V
Film forming rate: 4.62 nm/min
Film thickness: 4.5 nm Then, a Ru layer as the protective layer 13 was formed by means of an ion beam sputtering method.

The conditions for forming the protective layer 13 are as follows.

Target: Ru target
Sputtering gas: Ar gas (gas pressure: 0.02 Pa)
Voltage: 700 V
Film forming rate: 3.12 nm/min
Film thickness: 2.5 nm Then, on the protective layer 13, a TaN layer was formed as an absorber layer 14 by means of a magnetron sputtering method.

The conditions for forming the TaN layer are as follows.

(Film forming conditions for TaN layer)

Target: Ta target
Sputtering gas: mixed gas of Ar and $N_2$ (Ar: 86 vol %, $N_2$: 14 vol %, gas pressure: 0.3 Pa)
Applied power: 150 W
Film forming rate: 7.2 nm/min
Film thickness: 60 nm The EUV mask blank after forming the absorber layer 14 was subjected to heating treatment for 20 minutes in atmospheric air under controlling the range of 140±4° C. Further, the heating temperature means a temperature at a surface of the mask blank, and the heating time means time maintaining the temperature of the surface of the mask blank within the range of 140±4° C.

Further, regarding a surface oxide film formed on a TaN layer surface as the absorber layer 14 by the heating treatment for the absorber layer 14, namely, a surface oxide film of TaON, the film thickness was measured by using high performance thin layer X-ray reflectivity film thickness analytical instrument, manufactured by Rigaku Corporation by means of a X-ray reflectivity measurement method. As a result, the film thickness was 2 nm.

Further, before and after the heating treatment, the flatness of the surface and the rear surface was measured. Here, the surface of the EUV mask blank means a surface of the absorber layer 14. On the other hand, the rear surface of the EUV mask blank means a surface of the Cr film formed on the rear surface side of the substrate 11. The flatness was measured by using a Fizeau type laser interferometric flatness meter (manufactured by Fujinon, tradename: G310S). As a result, a similar value to the difference of the flatness in after-mentioned Example 2 was obtained.

Example 2

In this Example, an EUV mask blank 1' as shown in FIG. 2 was prepared.

In the EUV mask blank 1' in this Example, as the substrate 11, the same one was used as in Example 1, and a Cr layer as a high dielectric conductive coating on the rear surface side of the substrate 11, a Mo/Si multilayer reflective film (reflective layer 12), a Ru layer as the protective layer 13 and a TaN layer as the absorber layer 14 were formed under the same conditions as in Example 1.

Then, on the absorber layer 14, a TaON layer was formed as a low reflective layer 15 by means of a magnetron sputtering method.

The conditions for forming the TaON layer are as follows.

(Film forming conditions for TaON layer)

Target: Ta target

Sputtering gas: mixed gas of Ar, $N_2$ and $O_2$ (Ar: 49 vol %, $O_2$: 37 vol %, $N_2$: 14 vol % gas pressure: 0.3 Pa)

Applied power: 250 W

Film forming rate: 2.0 nm/min

Film thickness: 8 nm

The EUV mask blank after forming the low reflective layer 15 was subjected to heating treatment for 20 minutes in atmospheric air under controlling the range of 140±4° C. Further, the heating temperature means a temperature at a surface of the mask blank, and the heating time means time maintaining the temperature of the surface of the mask blank within the range of 140±4° C.

Further, before and after carrying out the heating treatment, the flatness of the surface and the rear surface of the EUV mask blank was measured. As a result, the difference in the flatness before and after the heating treatment was an after mentioned calculated value.

Further, regarding a surface oxide film formed on a TaON layer surface as the low reflective layer 15 by the heating treatment for the low reflective layer 15, the film thickness was measured by using high performance thin layer X-ray reflectivity film thickness analytical instrument, manufactured by Rigaku Corporation by means of a X-ray reflectivity measurement method. As a result, the film thickness was approximately 2 nm.

Comparative Example 1

After forming a protective layer 13 in the same order as in Example 1, an EUV mask blank after forming the protective layer 13 was subjected to heating treatment for 20 minutes in atmospheric air under controlling within the range of 140±4° C. That is, in Comparative Example 1, at a state before forming an absorber layer 14, the heating treatment was carried out. Regarding the measurement of the flatness before and after the heating treatment, after forming the protective layer 13, the flatness before the heating treatment was measured, and after forming the absorber layer 14, the flatness after the heating treatment was measured.

Regarding samples obtained in Example 1, Example 2 and Comparative Example 1, the degree of the difference in the flatness before and after the heating treatment is mentioned below.

Sample of Example 1

Surface: 0.217 μm

Rear surface: 0.237 μm

Sample of Example 2

Surface: 0.227 μm

Rear surface: 0.247 μm

Sample of Comparative Example 1

Surface: 0.195 μm

Rear surface: 0.192 μm

The degree of the difference in the flatness before and after the heating treatment shows how much the degree of warpage of a substrate 11 due to film stress is relaxed. It is evident from them that an effect to reduce the warpage of a substrate was improved by carrying out the heating treatment after forming an absorber layer.

INDUSTRIAL APPLICABILITY

According to the present invention, the film stress in the Mo/Si multilayer reflective film of the EUV mask blank can be relaxed, and thereby the deformation of a substrate can be reduced, and the change with time in the film stress in the Mo/Si multilayer reflective film can be suppressed. Further, the change in the reflective property of the Mo/Si multilayer reflective film can be suppressed, and when transferring a pattern by using a reflective mask produced from the EUV mask blank, the miss-positioning of a pattern and the formation of pattern defects can be suppressed. Accordingly, in the semiconductor industry, a reflective mask produced from the EUV mask blank of the present invention can be usefully used in the lithography technique of fine patterns required for forming integrated circuit having a fine pattern on a silicon substrate or the like.

This application is a continuation of PCT Application No. PCT/JP2012/080380, filed on Nov. 22, 2012, which is based upon and claims the benefit of priority from Japanese Patent Application No. 2011-257749 filed on Nov. 25, 2011. The contents of those applications are incorporated herein by reference in their entireties.

REFERENCE SYMBOLS

1, 1': EUV mask blank

11: Substrate

12: Reflective layer (Mo/Si multilayer reflective film)

13: Protective layer

14: Absorber layer

15: Low reflective layer

What is claimed is:

1. A process for producing a reflective mask blank for EUV lithography, which comprises forming a multilayer reflective film for reflecting EUV light on a film-forming surface of a substrate, then forming an absorber layer for absorbing EUV light, on the multilayer reflective film, to produce a reflective mask blank for EUV lithography, wherein the multilayer reflective film is a Mo/Si multilayer reflective film, the uppermost layer of the multilayer reflective film is a Si film, and after forming the absorber layer, the substrate on which the absorber layer is formed is subjected to heating treatment at a temperature of from 110 to 170° C.

2. The process for producing a reflective mask blank for EUV lithography according to claim 1, wherein after forming the absorber layer, the substrate on which the absorber layer is formed is subjected to heating treatment at a temperature of from 120 to 160° C.

3. The process for producing a reflective mask blank for EUV lithography according to claim 1, wherein after forming the multilayer reflective film, a protective layer for protecting the multilayer reflective film, is formed on the multilayer reflective film, the absorber layer is formed on the protective layer, and after forming the absorber layer, the substrate on which the absorber layer is formed is subjected to heating treatment.

4. The process for producing a reflective mask blank for EUV lithography according to claim 3, wherein the protective layer is a Ru layer or a Ru compound layer.

5. The process for producing a reflective mask blank for EUV lithography according to claim 1, wherein the heating treatment is carried out in the atmospheric air.

6. The process for producing a reflective mask blank for EUV lithography according to claim 1, wherein the absorber layer is a layer containing tantalum (Ta) and nitrogen (N) at the total content of at least 60 at %, and the absorber layer has a film thickness of from 5 to 100 nm.

7. The process for producing a reflective mask blank for EUV lithography according to claim 1, wherein the heating treatment is carried out to form a surface oxide film on the absorber layer.

8. A process for producing a reflective mask blank for EUV lithography, which comprises forming a multilayer reflective film for reflecting EUV light on a film-forming surface of a substrate, then forming an absorber layer for absorbing EUV light, on the multilayer reflective film, and forming a low reflective layer for an inspection light to be used for inspection of a mask pattern, on the absorber layer, to produce a reflective mask blank for EUV lithography, wherein the multilayer reflective film is a Mo/Si multilayer reflective film, the uppermost layer of the multilayer reflective film is a Si film, and after forming the low reflective layer, the substrate on which the low reflective layer is formed is subjected to heating treatment at a temperature of from 110 to 170° C.

9. The process for producing a reflective mask blank for EUV lithography according to claim 8, wherein after forming the low reflective layer, the substrate on which the low reflective layer is formed is subjected to heating treatment at a temperature of from 120 to 160° C.

10. The process for producing a reflective mask blank for EUV lithography according to claim 8, wherein after forming the multilayer reflective film, a protective layer for protecting the multilayer reflective film, is formed on the multilayer reflective film, the absorber layer is formed on the protective layer, the low reflective layer is formed on the absorber layer, and after forming the low reflective layer, the substrate on which the low reflective layer is formed is subjected to the heating treatment.

11. The process for producing a reflective mask blank for EUV lithography according to claim 10, wherein the protective layer is a Ru layer or a Ru compound layer.

12. The process for producing a reflective mask blank for EUV lithography according to claim 8, wherein the heating treatment is carried out in the atmospheric air.

13. The process for producing a reflective mask blank for EUV lithography according to claim 8, wherein the absorber layer is a layer containing tantalum (Ta) and nitrogen (N) at the total content of at least 60 at %, and the absorber layer has a film thickness of from 5 to 100 nm.

14. The process for producing a reflective mask blank for EUV lithography according to claim 8, wherein the low reflective layer is a layer containing tantalum (Ta), oxygen (O) and nitrogen (N) at the total content of at least 60 at %, and the low reflective layer has a film thickness of from 1 to 30 nm.

15. The process for producing a reflective mask blank for EUV lithography according to claim 8, wherein the heating treatment is carried out to form a surface oxide film on the low reflective layer.

16. A reflective mask blank for EUV lithography, which is obtained by the process for producing a reflective mask blank for EUV lithography as defined in claim 7 and has the surface oxide film having a film thickness of from 0.5 to 3 nm on the absorber layer.

17. A reflective mask blank for EUV lithography, which is obtained by the process for producing a reflective mask blank for EUV lithography as defined in claim 15 and has the surface oxide film having a film thickness of from 0.5 to 3 nm on the low reflective layer.

* * * * *